(12) United States Patent
Fuchs et al.

(10) Patent No.: US 9,455,742 B2
(45) Date of Patent: *Sep. 27, 2016

(54) COMPRESSION RATIO FOR A COMPRESSION ENGINE

(71) Applicant: INTERNATIONAL BUSINESS MACHINES CORPORATION, Armonk, NY (US)

(72) Inventors: Thomas Fuchs, Bietigheim-Bissingen (DE); Christian Jacobi, Poughkeepsie, NY (US); Anthony T. Sofia, Highland, NY (US); Joerg-Stephan Vogt, Holzgerlingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/949,102

(22) Filed: Nov. 23, 2015

(65) Prior Publication Data

US 2016/0079996 A1   Mar. 17, 2016

Related U.S. Application Data

(63) Continuation of application No. 14/665,325, filed on Mar. 23, 2015, now Pat. No. 9,197,243.

(30) Foreign Application Priority Data

Mar. 25, 2014 (GB) .................................. 1405314.4

(51) Int. Cl.
   *H03M 7/30* (2006.01)
(52) U.S. Cl.
   CPC .................................. *H03M 7/3086* (2013.01)
(58) Field of Classification Search
   CPC ..... H03M 7/30; H03M 7/3086; G10L 19/00; G06F 17/40; G06T 9/00
   USPC ................................. 341/50, 51, 106, 87, 67
   See application file for complete search history.

(56) References Cited

U.S. PATENT DOCUMENTS 5,140,321 A * 8/1992 Jung ................... H03M 7/3086
                                                                341/55
5,159,336 A * 10/1992 Rabin ................... G06F 3/0601
                                                                341/51

(Continued)

FOREIGN PATENT DOCUMENTS

| EP | 0677927 A2 | 4/1995 |
| WO | WO9317503 A1 | 9/1993 |
| WO | WO2009141677 A2 | 11/2009 |

OTHER PUBLICATIONS

International Search Report for GB1405314.4 dated Sep. 22, 2014, pp. 1-4.

(Continued)

*Primary Examiner* — Jean B Jeanglaude
(74) *Attorney, Agent, or Firm* — Margaret McNamara, Esq.; Blanche E. Schiller, Esq.; Heslin Rothenberg Farley & Mesiti P.C.

(57) ABSTRACT

An output sequence of data elements is processed. The output sequence of data elements represents a sequence of input data elements in a compressed format. An output data element includes a backward reference for each string in the input data elements that occurs again in an input data element that is used to produce the output data element. A backward reference identified in a selected output data element is used for selecting the string to which it refers in the stored input data elements. The selected string is combined with strings of one or more subsequent output data elements. A matching sequence in the stored input data elements matching at least part of one or more combined strings is found. A combined string of the one or more combined strings having the longest matching sequence is selected. The backward reference is redefined to indicate the longest matching sequence.

20 Claims, 3 Drawing Sheets

(56) References Cited

U.S. PATENT DOCUMENTS

| | | | | |
|---|---|---|---|---|
| 5,371,499 | A | * | 12/1994 | Graybill ............ G06T 9/005 341/106 |
| 5,406,279 | A | * | 4/1995 | Anderson ......... H03M 7/3086 341/51 |
| 5,970,177 | A | * | 10/1999 | Chinnock ............ G06T 9/005 358/1.15 |
| 6,008,743 | A | * | 12/1999 | Jaquette ............. G06T 9/005 341/51 |
| 6,624,762 | B1 | | 9/2003 | End, III |
| 7,043,494 | B1 | | 5/2006 | Joshi et al. |
| 7,185,041 | B1 | | 2/2007 | End, III |
| 7,538,695 | B2 | | 5/2009 | Laker et al. |
| 7,719,443 | B1 | | 5/2010 | Natanzon |
| 7,982,636 | B2 | | 7/2011 | Abali |
| 8,704,686 | B1 | | 4/2014 | Agarwal et al. |
| 8,766,827 | B1 | | 7/2014 | Milne |
| 9,197,243 | B2 | | 11/2015 | Fuchs et al. |
| 9,209,831 | B2 | | 12/2015 | Fuchs et al. |
| 2016/0049951 | A1 | | 2/2016 | Fuchs et al. |

OTHER PUBLICATIONS

International Search Report for GB1405315.1 dated Sep. 22, 2014, pp. 1-4.

List of IBM Patents or Patent Applications Treated as Related dated May 10, 2016, pp. 1-2.

* cited by examiner

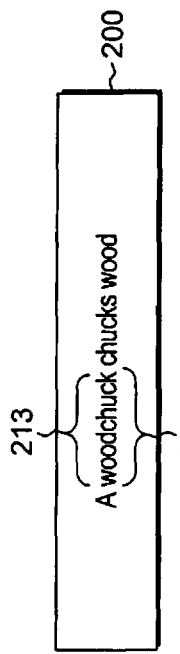
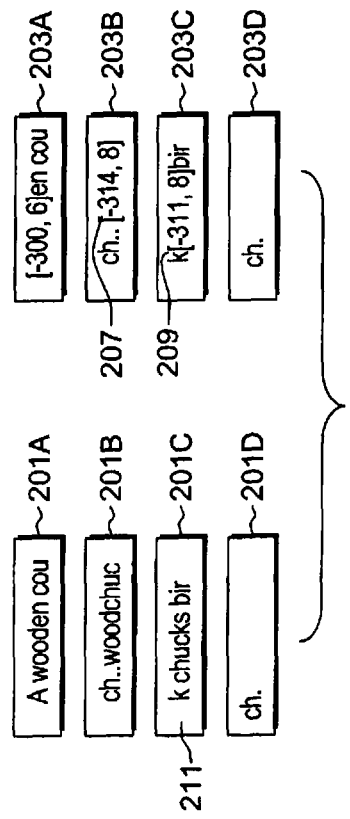
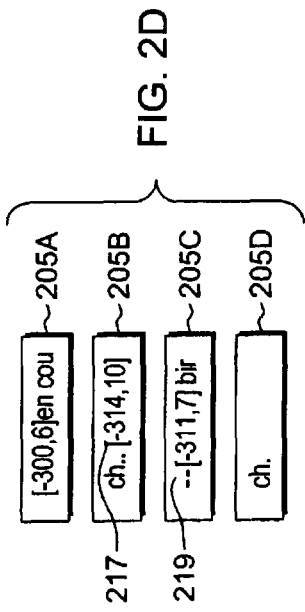
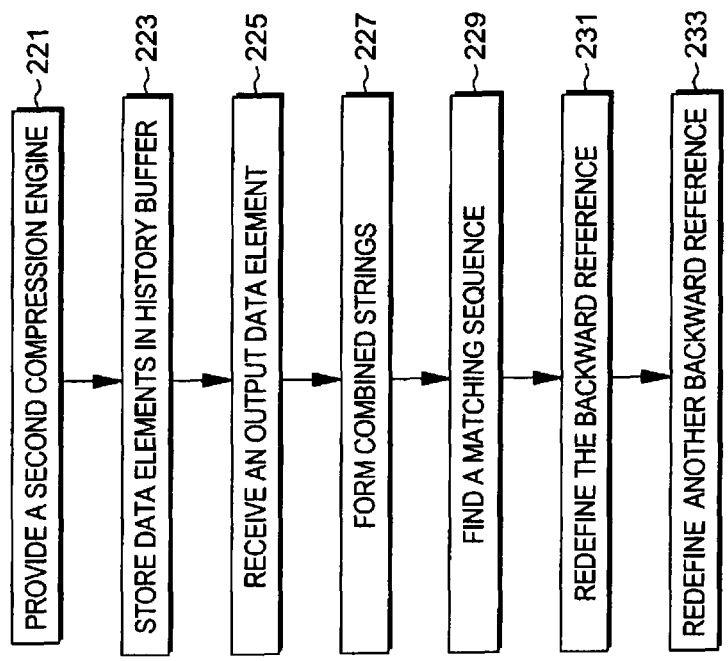

COMPRESSION RATIO FOR A COMPRESSION ENGINE

PRIOR FOREIGN APPLICATION

This application is a continuation of co-pending U.S. patent application Ser. No. 14/665,325, filed Mar. 23, 2015, entitled "IMPROVING A COMPRESSION RATIO FOR A COMPRESSION ENGINE," which claims priority from United Kingdom patent application number 1405314.4, filed Mar. 25, 2014, each of which is hereby incorporated herein by reference in its entirety.

BACKGROUND

One or more aspects relate generally to data processing systems and more specifically to improving a compression ratio for a compression engine.

Currently available compression algorithms such as Deflate that uses a combination of the LZ77 algorithm and Huffman coding provide a compressed data format. The usage of the compressed data format has the advantage of saving storage resources. However, there is a continuous need to improve the compression ratio of existing compression algorithms.

SUMMARY

Shortcomings of the prior art are overcome and additional advantages are provided through the provision of a method of processing an output sequence of data elements in a data processing system. The method includes identifying by a compression engine of the data processing system a backward reference in a selected output data element of the output sequence of data elements; using by the compression engine the identified backward reference for selecting a string to which it refers; combining the selected string with one or more strings of one or more subsequent output data elements to form one or more combined strings; finding one or more matching sequences in a sequence of input data elements matching at least part of the one or more combined strings; and redefining the backward reference to indicate a selected matching sequence, thereby generating a redefined output data element.

Computer program products and systems relating to one or more aspects are also described and claimed herein.

Additional features and advantages are realized through the techniques described herein. Other embodiments and aspects are described in detail herein and are considered a part of the claimed aspects.

BRIEF DESCRIPTION OF THE SEVERAL VIEWS OF THE DRAWINGS

In the following, embodiments of the invention will be described in greater detail by way of example only making reference to the drawings in which:

FIG. 2A is one example of a flowchart of processing an output data element in a compressed format;

FIG. 2B is one example of a previously processed data string;

FIG. 2C depicts an example of an input sequence of data elements and an output sequence of compressed data elements, respectively;

FIG. 2D depicts an example of compressed output data elements from FIG. 2C after the backward reference redefinition.

DETAILED DESCRIPTION

Figure 1:
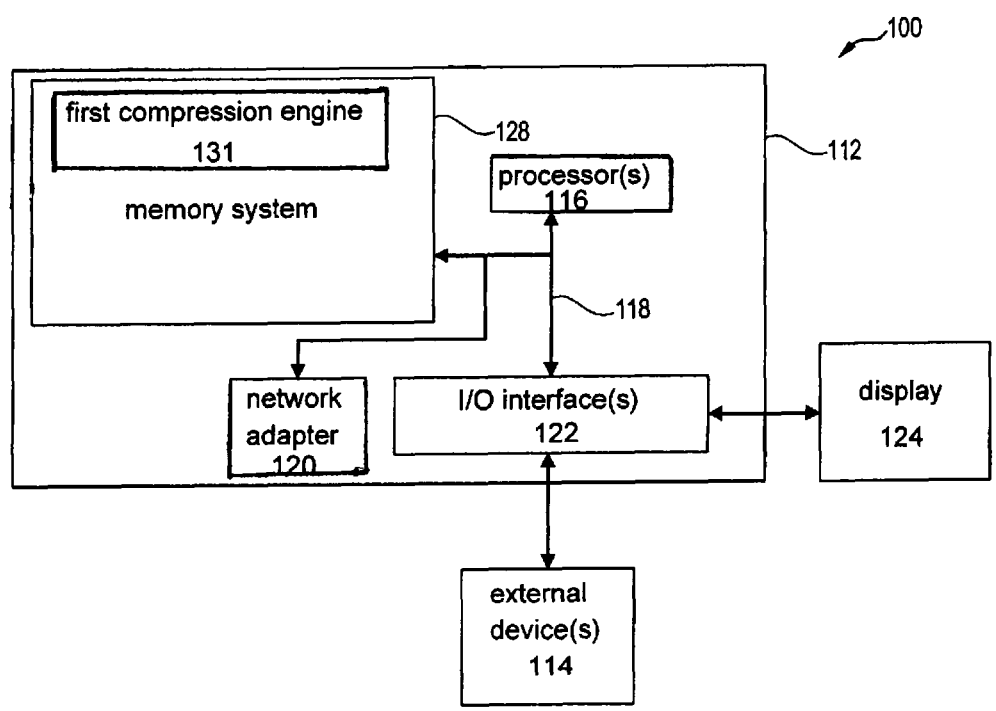
FIG. 1 illustrates an exemplary data processing system in which at least part of the method may be implemented.

In the following, like numbered elements in the figures either designate similar elements or designate elements that perform an equivalent function. Elements which have been discussed previously will not necessarily be discussed in later figures if the function is equivalent.

The term "data element" as used herein refers to a predetermined number of bits or bytes of data of a data unit. The data element may be transmitted through a data path to, and/or output from, a functional block, during a single execution cycle of the functional block. For example, a 100 byte data unit may be transmitted as a series of ten data elements with each data element containing ten bytes.

The term "compression ratio" as used herein refers to the data compression ratio which is defined as the ratio between the uncompressed size and compressed size of data.

The term "string" as used herein refers to an ordered sequence of symbols or binary data. Strings may include a string of text, binary data, or a combination thereof. String data has a length that may be measured in terms of bytes.

The term "pipeline" as used herein refers to a circuit partitioned into separate clocked registers by stages. If each stage takes one clock cycle, the processing time of the pipeline is the number of stages in the pipeline. Different stages can perform their function (e.g., execute different instructions) in parallel, wherein data (including instructions) are sequentially supplied from an input and obtained from an output after being processed in the different stages.

The term "matching" refers to the process of, given a data element of a data unit and a pattern of the given data element, finding occurrences of the pattern in previous bytes in the data unit that have been processed before processing the given data element.

One or more aspects improve the compression ratio of the data processing system that runs an existing compression engine that produces the output data elements. This may result in an additional saving of storage space that would otherwise be required when running the existing compression engine alone. One or more aspects are used for output data elements of conventional hardware compression engines that compute short length matches, at most as long as the data stored in each data element, which leads to a non-optimal compression ratio.

One or more aspects may work for any existing compression method that computes limited length matches (e.g. the length indicated by a backward reference).

In one aspect, a method for processing an output sequence of data elements in a data processing system is provided. The output sequence of data elements represents a sequence of input data elements in a compressed format, wherein an output data element comprises a backward reference for each string in the input data elements that occurs again in the input data elements that are used to produce the output data element, wherein the input data elements are stored in a history buffer, the method comprising: a. identifying by an extended matcher of the data processing system a backward reference in a selected output data element; b. using by the extended matcher the identified backward reference for selecting the string to which it refers in the stored input data elements; c. combining by the extended matcher the selected string with strings of one or more subsequent output data elements to the selected output data element for forming one or more combined strings; d. finding by the extended matcher a matching sequence in the stored input data elements matching at least part of the one or more combined strings, and selecting a combined string of the one or more combined strings having the longest matching sequence; and e. redefining by the extended matcher the backward reference to indicate the longest matching sequence, thereby generating a redefined output data element.

In one example, a data element may comprise a validity bit that indicates whether the data element is a valid data element or not. For example, steps c-e or a-e of one embodiment of the method may be executed if the selected output data element is a valid data element.

According to one embodiment, the data processing system comprises a hardware logic system having a multi-stage pipeline structure, wherein the output sequence of data elements is received in a stream of data elements, wherein the selected output data element is the currently received output data element, wherein steps a-e are processed at a rate of one step per clock cycle.

In one example, the second sequence of data elements may flow along a data path of the extended matcher at a rate of one output data element per clock cycle. For example, during execution of step a at a given clock cycle the selected output data element is available during that clock cycle. In a next clock cycle step b may be executed on the selected output data element that is now available in the next clock cycle.

This embodiment may, for example, further facilitate the integration of the extended matcher in a pipeline that can include first an initial matcher (e.g. of an existing hardware compression engine that is used to search for duplicates and to compress data), and then the extended matcher.

According to one embodiment, a first subsequent output data element of the one or more subsequent output data elements in the stream of data elements is received by the extended matcher, the first subsequent output data element following the selected output data element being a former output data element. Step d further comprises in case the selected combined string comprises all strings of the first subsequent output data element and a second subsequent output data element in the stream of data elements is received, repeating steps c-d on the former output data element for combining the selected string with strings of the second subsequent output data element, the second subsequent output data element following the first subsequent output data element, and invalidating the first subsequent output data element.

In one example, the invalidating comprises setting a validity bit of the first subsequent output data element to a value that indicates the first subsequent output data element as invalid, and thus steps c-e may not be executed on the first subsequent data element.

One or more aspects may further comprise executing steps a and b on the first subsequent output data element in parallel to executing steps b and c-d on the former output data element respectively.

According to one embodiment, the selected combined string comprises part of the second subsequent data element, and the method further comprises executing step e on the former output data element in parallel to executing steps c-d on the second subsequent output data element.

These embodiments may, for instance, provide reliable compression results, as the valid output data elements are processed in a synchronized manner (i.e. not mixed up with invalid results) such that the right matching output is produced.

Further, the results may be stable such that they may be predictable e.g. for evaluating the performance of the data processing system.

According to one embodiment, the selected string is combined with strings of at least two subsequent output data elements in the output sequence of data elements. This may further increase the compression ratio of compressed data produced by one or more aspects of the present method. For example, the combination may be performed with every string in subsequent output data elements until a predefined maximum matching length is reached, e.g. 258 bytes.

According to one embodiment, the backward reference indicates a length of the occurred string and a distance in number of bytes scanned backwards, starting from the first literal preceding matched literals of the selected output data element, through the stored input data elements to find the earlier occurred string.

According to one embodiment, redefining the backward reference comprises extending the length of the backward reference. This may be seamlessly integrated within compression environments that use, for instance, the LZ77 compression algorithm which provides the distance and length as defined above.

According to one embodiment, the extended length is greater than the size of a single input or output data element. The extension covers more than one new coming output data elements which may thus increase the compression ratio.

According to one embodiment, the distance in bytes is less than the size of the history buffer. This may further facilitate the integration of one or more aspects with existing systems. For example, if the history buffer is a buffer used by a first compression engine that outputs data elements to the extended matcher, one or more aspects may not perform a wrong match that extends beyond the capacity of the history buffer.

According to one embodiment, the method further comprises nullifying each byte of the one or more subsequent output data elements that stores data included in the combined string.

According to one embodiment, the method further comprises shortening the length of a backward reference of the one or more subsequent output data elements in case the length is greater than a predefined minimum number of bytes. For example, the minimum number of bytes is 3 bytes.

These embodiments may, for instance, further increase the accuracy and reliability of the produced results by, for example, avoiding re-matching data that has already been matched with respect to a processed data element.

According to one embodiment, the sequence of input data elements is received and processed by a first compression engine to output the sequence of the output data elements. The method further comprises providing a second compression engine that is connected to the first compression engine; controlling the first compression engine to forward the output data elements and corresponding input data elements to the second compression engine; wherein the second compression engine comprises the extended matcher.

According to one embodiment, the compression format is obtained using an LZ77 algorithm.

According to one embodiment, the method further comprises comparing the length of the redefined backward reference with the length of the rightmost backward reference; outputting one of the redefined output data elements and the selected output data element based on the results of the comparison. In other terms, the redefining of the backward reference is only performed if the new matching length becomes greater than the previous one provided by the first compression engine i.e. extension is possible. For example, if the length of the redefined output data element is greater than the length of the selected output data element, the redefined output data element is outputted.

In another example, the redefined output data element may be outputted only if the compression ratio that may result is improved by a given percentage, e.g. if the compression ratio becomes 20% higher.

FIG. 1 shows a data processing system 100 as comprising a computer system 112. The computer system 112 is shown in the form of a general-purpose computing device. The components of computer system 112 may include, but are not limited to, one or more processors or processing units 116, a memory system 128, and a bus 118 that couples various system components including memory system 128 to processor 116.

Computer system 112 typically includes a variety of computer system readable media. Such media may be any available media that is accessible by computer system 112, and it includes both volatile and non-volatile media, removable and non-removable media.

Memory system 128 may include computer system readable media in the form of volatile memory, such as random access memory (RAM) and/or cache memory. The memory system 128 may include one or more active buffered memory devices. The active buffered devices may include a plurality of memory elements (e.g., chips). The active buffered memory device may include layers of memory that form a three dimensional ("3D") memory device where individual columns of chips form vaults in communication with the processing units 116. The active buffered memory device may comprise partitions that may be concurrently accessed by a plurality of processing elements, where the partitions may be any suitable memory segment, including but not limited to vaults.

Computer system 112 may also communicate with one or more external devices 114 such as a keyboard, a pointing device, a display 124, etc.; one or more devices that enable a user to interact with computer system 112; and/or any devices (e.g., network card, modem, etc.) that enable computer system 112 to communicate with one or more other computing devices. Such communication can occur via I/O interface(s) 122. Still yet, computer system 112 can communicate with one or more networks such as a local area network (LAN), a general wide area network (WAN), and/or a public network (e.g., the Internet) via network adapter 120. As depicted, network adapter 120 communicates with the other components of computer system/server 112 via bus 118.

The data processing system 100 may be part of a network of computers such as a cloud computing environment. The network may provide communication links between various devices and computers connected together within the network. The network may include connections, such as wire, wireless communication links, or fiber optic cables.

Memory system 128 may comprise a first compression engine 131 for compressing data.

In another example, the data processing system 100 may comprise a hardware logic system having a multi-stage pipeline structure in which aspects of the present method may be implemented. In this case, the first compression engine 131 may be an electronic circuit part of the data hardware logic system. The hardware logic system may comprise a series of logic units.

FIG. 2A is one example of a flowchart of a method for processing an output sequence of data elements 203A-D (FIG. 2C) representing a sequence of input data elements 201A-D (FIG. 2C) in a compressed format.

The compressed format of the input data element 201 may be obtained using an LZ77 algorithm. The LZ77 algorithm may be executed by the first compression engine 131 in order to compress data.

The LZ77 performs the compression by using data repeat, that is, to generate literals and [distance, length] tuples, where distance may be the number of characters to be scanned backwards in the input data elements to find the previous occurrence of the string which matches the string starting at the current position, and length is the length of the recurring string.

For example, output data element 203A (FIG. 2C) comprises a backward reference [−300,6] that refers to the string "A wood" having a length of 6 bytes and it is occurred 300 bytes backward in a previously processed data string 200 (FIG. 2B). Also, output data element 203C (FIG. 2C) comprises a backward reference [−311,8] that refers to the string "chucks". And in order to find the string "chucks" to which the backward reference (−311 and 8) refers, a backward scanning may be performed on the previously processed bytes of the data elements 201A-C starting from the first left byte 211 of the backward reference [−311,8].

In step 221 (FIG. 2A), a second compression engine is provided. The second compression engine may have access to the output data elements 203A-203D. This may be done either by controlling the first compression engine 131 to forward the output data elements 203A-203D to the second compression engine or to configure the second compression engine within the data processing system 100 such that it can intercept the output data elements 203A-D when they are output by the first compression engine 131. In a further example, the output data elements 203A-D may be stored in a storage device by the first compression engine 131 and may be read from the storage device by the second compression engine. The second compression engine comprises the extended matcher.

In step 223, the input data elements 201A-D and the output data elements 203A-D may be stored in a history buffer, e.g. memory system 128. For example, as soon as an input data element, e.g. 201A, is processed by the first compression engine, it is stored in the history buffer.

In step 225, the second compression engine may receive (or select) an output data element 203B for processing. For example, the second processing engine may select the rightmost backward reference 207 that refers to the string "woodchuc" that is encoded in the rightmost bytes of the output data element 203B. However, other backward references can be selected.

In step 227, the second compression engine may form combined strings starting from the selected string 'woodchuc'. For example, the second compression engine may combine the selected string 'woodchuc' with strings of one or more subsequent output data elements 203C and 203D for forming one or more combined strings. The content of the one or more subsequent output data elements 203C and 203D may be read from the history buffer using the input data elements. For example, 'woodchuc' may be combined with the string 'k' of output data element 203C. In another example, the string 'woodchuc' may be combined with the string 'k'. That is, the combination may be done for example by adding in each combination one or more bytes from the two subsequent output data elements 203C and 203D to the string 'woodchuc'.

In step 229, the second compression engine may find a matching sequence in the stored input data elements 200 and 201A-D matching at least part of the one or more combined strings. For example, the combined string 'woodchuck' may be found in the string 200 i.e. 213. And the combined string 'woodchuck' may be found in the string 200 i.e. 215. By comparing the matching sequences 213 and 215, the second compression engine may select the longest matching sequence 215.

In step 231, the second compression engine may redefine the backward reference 207 to indicate the longest matching sequence 215. This may result in a redefined output data element 205B. The redefined backward reference 217 may indicate the same distance i.e. −314 as the distance of the backward reference 207. However, the length of the backward reference 207 i.e. 8 bytes has been extended to 10 bytes as the longest matching sequence 215 has an extension of two characters 'k' with respect to the string 'woodchuc' to which the backward reference 207 refers.

It is to be noted that the extended matching sequence 215 (with length 10 bytes) spans the 12 byte boundary.

In order to not produce the string 'k' twice, the backward reference 209 may also be redefined in the output data element 205C in step 233. This may be done by shortening the length of 8 bytes that was referring to the string 'chucks' in output data element 203C, such that it refers to the length of the string 'chucks' since the space ' ' at the beginning of 'chucks' has been matched in combination with the string 'woodchuck' in step 229. In addition, the two first bytes 219 (shown as --) in the output data element 205C has been nullified ("invalidated"). For example, the two first bytes may be nullified by iteratively pushing data one to the right. Overall the compression has become better since the uncompressed string 'k' is saved by folding it into the [−314,10] reference.

Figure 3:
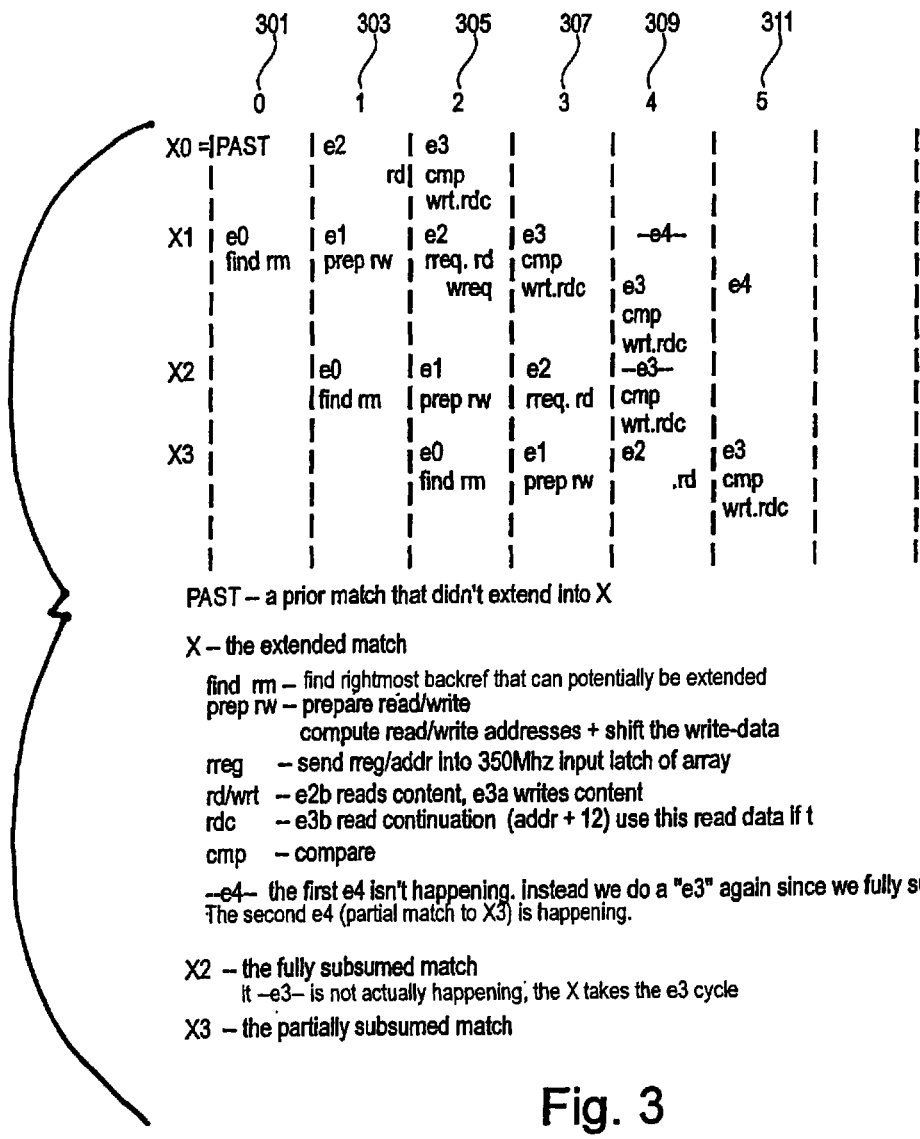
FIG. 3 illustrates a timing diagram for processing a sequence of multiple output data elements.

FIG. 3 is one example of a timing diagram for a method for compressing output data elements received in a stream of data elements by the hardware logic system. The output data elements may be in a compressed format of inputted data elements processed and outputted by the first compression engine.

For example, the data elements may be received in a stream of data elements. And, in case the data processing system 100 is a hardware logic system having a multi-stage pipeline structure, steps a, b, c-d and e of one or more aspects of the method may be processed one per clock cycle e.g. cycle E1, E2, E3 and E4, respectively. This is shown below in more technical details, e.g. commands/instructions to be executed per clock cycle.

cycle E0: receive matches (e.g. backward references) from a first matcher (e.g. the first compression engine 131), identify last match, and stage everything to E1.
cycle E1: Compute access address for lookback buffer (i.e. the history buffer)
cycle E2: Access the lookback buffer
    E2a synchronize read address from a latch of E2, E2-latch into E2b 350 Mhz sram-addr latch
    E2b perform read; synchronize write address from E2-latch into E3a 350 Mhz sram-addr latch
cycle E3
    cycle E3a perform write e.g. of the read data at E2b;
    cycle E3b perform "continuation read" e.g. the continuation read is the prior E2b read+12 bytes further.
    In case the subsequent data element was completely subsumed, mux the result of the E3b over the new E2b in that case.
    cycle E3c. Compare the raw data (i.e. input data elements in history buffer), determine whether there is an overlap all the way to the end without exceeding the max length for matches, e.g. 258 bytes.
cycle E4: update the matches
cycle E5: send data to the Huffman coder FIG. 3 shows a sequence of four data elements X0-X3 in a compressed format. The data element X0 has already been processed. X1 is the current data element that is received in a first clock cycle 301. In a next second clock cycle 303, the subsequent data element X2 may arrive. In a next third clock cycle 305, the subsequent data element X3 may arrive.

Before X2 arrives, the step E0 is executed on the data element X1. At clock cycle 303, the step E1 is executed on the data element X1 in parallel to the execution of step E0 on the data element X2. At clock cycle 305, the steps E2, E1 and E0 are executed in parallel on the data elements X1, X2 and X3 respectively. Next clock cycle 307, the steps E3, E2 and E1 are executed in parallel on the data elements X1, X2 and X3 respectively. However, when E3 is executed on X1, the combined string that is selected includes all strings of the subsequent data element X2. Thus, the data element X2 is invalidated. In clock cycle 309, the step E3 is executed again for further combing strings from X3 in parallel to the execution of step E2 on X3. In this case, the combined string has only part of X3. Therefore, in the next clock cycle 311, steps E4 and E3 are executed in parallel on X1 and X3 respectively.

A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in the form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

It is understood that one or more of the aforementioned embodiments may be combined as long as the combined embodiments are not mutually exclusive.

What is claimed is:

1. A method of processing an output sequence of data elements in a data processing system, the method comprising:
    identifying by a compression engine of the data processing system a backward reference in a selected output data element of the output sequence of data elements;
    using by the compression engine the identified backward reference for selecting a string to which it refers;
    combining the selected string with one or more strings of one or more subsequent output data elements to form one or more combined strings;
    finding one or more matching sequences in a sequence of input data elements matching at least part of the one or more combined strings; and
    redefining the backward reference to indicate a selected matching sequence, thereby generating a redefined output data element.

2. The method of claim 1, wherein the finding comprises finding a plurality of matching sequences, and the method further comprises selecting the selected matching sequence from the plurality of matching sequences based on a selection criteria.

3. The method of claim 2, wherein the selection criteria comprises a longest matching sequence.

4. The method of claim 1, wherein the output sequence of data elements represents the sequence of input data elements in a compressed format.

5. The method of claim 1, wherein the backward reference indicates a length of the selected string, and a distance in number of bytes scanned backwards in a previously processed data string in which the selected string occurred.

6. The method of claim 1, wherein the redefining the backward reference comprises extending a length of the backward reference.

7. The method of claim 6, wherein the extended length is greater than a size of a single input or output data element.

8. The method of claim 1, wherein the redefining the backward reference comprises shortening a length of the backward reference.

9. The method of claim 1, further comprising nullifying one or more bytes of the redefined output data element.

10. The method of claim 1, further comprising:
comparing a length of the redefined backward reference with a length of the backward reference; and
outputting one of the redefined output data element and a selected output data element based on the results of the comparison.

11. A computer system for processing an output sequence of data elements in a data processing system, the computer system comprising:
a memory; and
a processor in communication with the memory, wherein the computer system is configured to perform a method, said method comprising:
identifying by a compression engine of the data processing system a backward reference in a selected output data element of the output sequence of data elements;
using by the compression engine the identified backward reference for selecting a string to which it refers;
combining the selected string with one or more strings of one or more subsequent output data elements to form one or more combined strings;
finding one or more matching sequences in a sequence of input data elements matching at least part of the one or more combined strings; and
redefining the backward reference to indicate a selected matching sequence, thereby generating a redefined output data element.

12. The computer system of claim 11, wherein the output sequence of data elements represents the sequence of input data elements in a compressed format.

13. The computer system of claim 11, wherein the backward reference indicates a length of the selected string, and a distance in number of bytes scanned backwards in a previously processed data string in which the selected string occurred.

14. The computer system of claim 11, wherein the redefining the backward reference comprises extending a length of the backward reference or shortening the length of the backward reference.

15. The computer system of claim 11, wherein the method further comprises nullifying one or more bytes of the redefined output data element.

16. A computer program product for processing an output sequence of data elements in a data processing program product, the computer system comprising:
a computer readable storage medium readable by a processing circuit and storing instructions for execution by the processing circuit for performing a method comprising:
identifying by a compression engine of the data processing system a backward reference in a selected output data element of the output sequence of data elements;
using by the compression engine the identified backward reference for selecting a string to which it refers;
combining the selected string with one or more strings of one or more subsequent output data elements to form one or more combined strings;
finding one or more matching sequences in a sequence of input data elements matching at least part of the one or more combined strings; and
redefining the backward reference to indicate a selected matching sequence, thereby generating a redefined output data element.

17. The computer program product of claim 16, wherein the output sequence of data elements represents the sequence of input data elements in a compressed format.

18. The computer program product of claim 16, wherein the backward reference indicates a length of the selected string, and a distance in number of bytes scanned backwards in a previously processed data string in which the selected string occurred.

19. The computer program product of claim 16, wherein the redefining the backward reference comprises extending a length of the backward reference or shortening the length of the backward reference.

20. The computer program product of claim 16, wherein the method further comprises nullifying one or more bytes of the redefined output data element.

* * * * *